United States Patent [19]

Schneider et al.

[11] Patent Number: 4,654,964
[45] Date of Patent: Apr. 7, 1987

[54] SENSOR FOR COMPONENT PLUG-IN

[75] Inventors: Bernd Schneider; Stefan Mueller, both of Munich, Fed. Rep. of Germany

[73] Assignee: Siemens Aktiengesellschaft, Berlin and Munich, Fed. Rep. of Germany

[21] Appl. No.: 816,438

[22] Filed: Jan. 6, 1986

[30] Foreign Application Priority Data

Jan. 8, 1985 [DE] Fed. Rep. of Germany ....... 3500421

[51] Int. Cl.⁴ .................... B23P 21/00; B23P 19/00
[52] U.S. Cl. .................... 29/705; 29/33 M; 29/407; 29/741; 29/759
[58] Field of Search ............. 29/33 M, 407, 705, 720, 29/721, 739, 741, 759, 834

[56] References Cited

U.S. PATENT DOCUMENTS

| | | | |
|---|---|---|---|
| 3,932,931 | 1/1976 | Wright | 29/720 X |
| 4,127,936 | 12/1978 | Schlup et al. | 29/739 X |
| 4,312,109 | 1/1982 | Kawana et al. | 29/739 X |
| 4,590,660 | 5/1986 | Starski | 29/705 X |
| 4,598,456 | 7/1986 | McConnell | 29/721 X |

Primary Examiner—Howard N. Goldberg
Assistant Examiner—Ronald S. Wallace

[57] ABSTRACT

In the automatic equipping of, for example, printed circuit boards with components, the problem of the unknown position of the component legs occurs. According to the invention, the positions of the component legs in a component picked up by a gripper are measured by a sensor immediately before plug-in. This sensor is essentially composed of two independently horizontally movable perforated plates, each including an infrared emitting diode which emits onto a stationary position photodiode situated therebelow. The measured result can be employed for the positional correction or for the rejection or acceptance of the component.

8 Claims, 2 Drawing Figures

SENSOR FOR COMPONENT PLUG-IN

BACKGROUND OF THE INVENTION

1. Field of the Invention

The invention relates to a sensor for determing the position of leads of electronic components during automatic component plug-in and particularly for components having two leads.

2. Description of the Prior Art

The problem of the unknown position of the legs of electronic components occurs when the components are grabbed at their body even though the position of the gripper is known. This occurs as a result of the fact that great tolerances between the grid or spacing of the component legs and the outside contour of the component frequently occur in the manufacture of electronic components. The insertion reliability is thereby deteriorated so greatly given automatic plug-in that an automatic plug-in of such components was hitherto not possible.

SUMMARY OF THE INVENTION

An object of the invention is to provide a sensor which will accurately determine the position of the electric component legs. A check should also be possible to see whether one or both legs of a two-lead component are so greatly bent that a position determination by the sensor is no longer possible.

This object is achieved by providing two perforated plates indexed or held in an idle position which are upwardly displaceable by a drive along a linear guide into a measuring position, thereby coming free from the indexing and being freely movable in a horizontal direction by means of further linear guides, each perforated plate carrying an infrared light-emitting diode which is positioned opposite a respective, stationary positioning photodiode at whose output an evaluation electronics is provided, the result of the latter serving for at least one of positional correction an rejection of the components.

Upon utilizing a sensor embodying the principles of the present invention, the positions of the component legs of a component picked up in a gripper are measured immediately before plug-in. The result, if necessary, can be used for a correction in the position of the component or for the selective good-bad recognition of the component, that is, acceptance or rejection. When one or both component legs are so greatly bent that they can no longer dip into the capture funnel, the lifting motion in the measuring location is interrupted and the component is separated out for rejection.

BRIEF DESCRIPTION OF THE DRAWINGS

The invention shall be explained with reference to the figures. Shown therein are.

DESCRIPTION OF THE PREFERRED EMBODIMENTS

Figure 1:
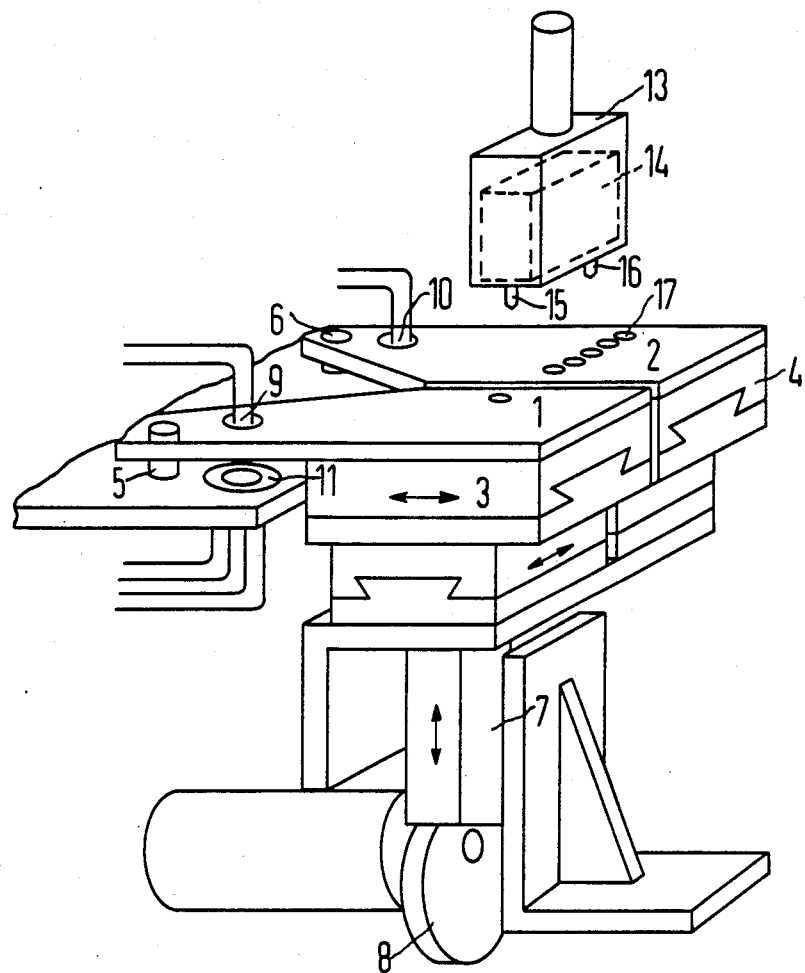
FIG. 1 is a component leg position sensor of the invention in a schematic, perspective illustration.

In the figures, two perforated plates 1, 2 are seated on easily movable x, y, or horizontally movable carriages 3, 4. The carriages are independently movable in any horizontal movement due to a pair of perpendicularly arranged guides forming each of the carriages 3, 4. In an idle or lower position, the two perforated plates 1, 2 are indexed by cone tips 5, 6 to be held in a specific horizontal orientation and position. The carriages 3, 4 are seated on a further carriage 7 which, on the basis of a suitable drive 8, vertically moves both perforated plates simultaneously out of engagement with the indexing tips into a measuring location and back. The perforated plates each carry an infrared light-emitting diode 9, 10 to which a respective, rigidly situated x,y position photodiode 11, 12 (FIG. 2) is allocated. A component 14 with its two connecting legs 15, 16 is situated above the perforated plates 1, 2 in a gripper 13. Capture funnels 17 are situated therebelow, in the plates 1, 2, these merging into capture bores 18 sized to accept the leg diameters.

Figure 2:
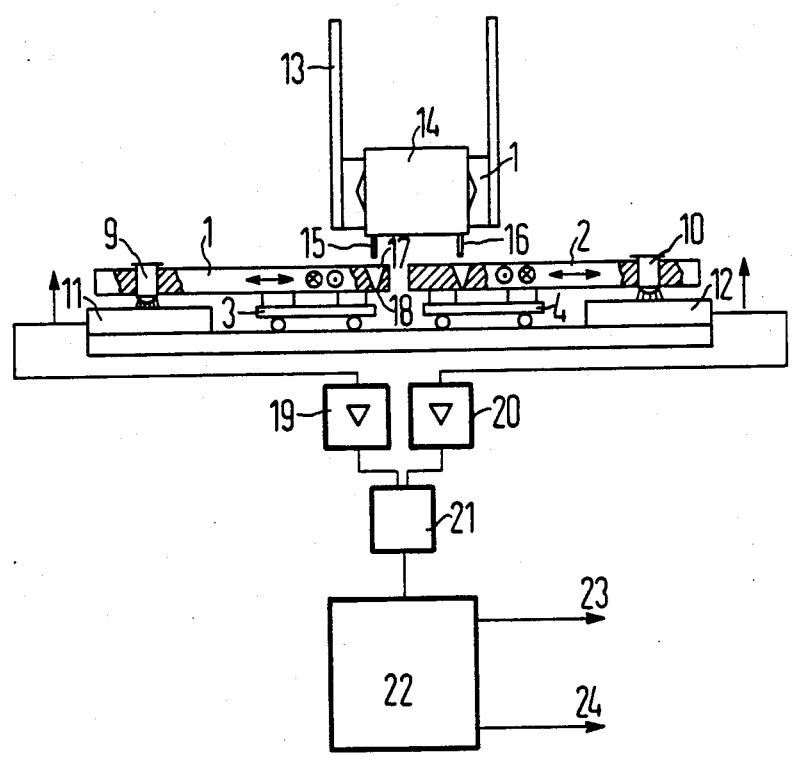
FIG. 2 is a side sectional view through the sensor with evaluation electronics schematically shown.

FIG. 2 also shows two amplifiers 19, 20 with a following evaluation electronics 21. A controller 22 is connected to the evaluation electronics, this controller either initiating the removal of the component via line 23 or executing a positional correction at the automatic plug-in unit via line 24.

The capture funnels are applied in the perforated plate such that the spacing of the funnels from one another in the indexed zero position amounts to a multiple of the grid or spacing dimension between the legs 15, 16 of the component 14. Plate 1 is illustrated as having a single funnel, and plate 2 has a multitude of funnels.

The function of the sensor ensues in the following way:

The component 14 picked up in the gripper 13 is positioned over the sensor such that the rated positions of the component legs 15, 16 are situated exactly above the appertaining capture bores 17. The upward work stroke of drive 8 releases the perforated plates 1, 2 out of the indexing 5, 6. The perforated plates are thereby deflected out of the zero position in x, y direction by the amount of the misadjustment of the legs, being thusly deflected by the component legs dipping into and engaging with the capture funnels 17.

The measurement of the horizontal or x, y excursion of the plates 1, 2 is provided via the modification or movement of the light spot position of the light-emitting diodes 9, 10 on the active surface of the positioning photodiodes 11, 12. The signal evaluation determines the amount of the misadjustment of every component leg in x and y direction.

The measured result can be evaluated in various ways. The range of still-allowable deviation leading to a successful joining upon plug-in can be set for every leg via an electronic window discriminator. Components whose connection legs lie outside of this range can be separated out for rejection and/or reworking via a program routine.

Another possibility is to forward the measure signals (for example, via a sensor interface) to the control of the plug-in device (for example, of an industrial robot) and to execute a positional correction with the deviations from the rated position as a controlling variable during plug-in.

Insertion is thus possible despite an incorrect absolute position of the component legs. Components wherein the mutual spacing of the legs lies outside of the tolerance required for insertion can be separated out.

System errors (for example temperature response) which may potentially exist in the plug-in device are co-acquired in the measurement and can thus be compensated.

Two-leg components of any arbitrary size can be measured due to the arrangement of the capture funnels in grid dimension.

As is apparent from the foregoing specification, the invention is susceptible of being embodied with various alterations and modifications which may differ particularly from those that have been described in the preceeding specification and description. It should be understood that we wish to embody within the scope of the patent warranted hereon all such modifications as reasonably and properly come within the scope of our contribution to the art.

We claim as our invention:

1. A sensor for the determination of the position of leads of electronic components in automatic component plug-in, comprising: two perforated plates indexed in the idle position are upwardly displaceable by a drive along a linear guide into a measuring position, thereby coming free from the indexing and being freely movable in x, y direction by means of further linear guides; each perforated plate carrying an infrared light-emitting diode which is positioned opposite a respective, stationary positioning photodiode at whose output an evaluation electronics is provided, the result of the latter serving for at least one of positional correction and rejection of the components.

2. A sensor according to claim 1, wherein capture bores are provided in the perforated plates, said bores merging upwardly into capture funnels.

3. A sensor according to claim 2, wherein capture bores are provided for every possible arrangement of the leads and are applied such that the spacing of the funnels relative to one another in the indexed zero position amounts to a multiple of a leg spacing dimension.

4. A sensor according to claim 1, wherein an electronic window discriminator is provided via which the range of deviation still permitted and leading to a successful joining upon insertion can be set for every lead.

5. A sensor for determining the position of a pair of leads of an electronic component during an automatic component plug-in operation comprising:

a pair of plates, means for simultaneously moving said plates vertically between a lower inoperative position and a raised measuring position, means for indexing said plates into a preset horizontal position in said lower position, guide means for permitting said plates to move horizontally, independently of each other in said raised measuring position, means engagable with said component leads for causing said plates to move horizontally in accordance with the position of said leads as said plates are raised to said measuring position, an infrared light-emitting diode carried on and movable with each of said plates, a stationary positioning photodiode positioned opposite each of said light-emitting diodes to detect horizontal movement of said light-emitting diodes and to provide a corresponding electrical output, and evaluation circuitry means receiving said output of said positioning photodiodes for at least one of postional correction and rejection of the components.

6. A sensor according to claim 5, wherein said means engagable with said component leads for causing said plates to move horizontally comprises funnel shaped openings in the top surface of said plates wherein the open top of the funnel is large enough to capture the lead of the component and the engagement of the leads against the side walls of the funnel causing the plates to move horizontally.

7. A sensor according to claim 6, wherein funnels are provided in a spaced arrangement on at least one of the movable plates to accomodate the leg spacing dimension of a multitude of component configurations.

8. A sensor according to claim 5, wherein an electronic window discriminator circuit is provided by which the range of deviation allowable to permit a successful joining of the leads of the component can be set for every lead.

* * * * *